US010091889B2

United States Patent
Stoll et al.

(10) Patent No.: US 10,091,889 B2
(45) Date of Patent: Oct. 2, 2018

(54) PROCESS OF PRODUCING A COMPONENT AND APPARATUS THAT PRODUCES A COMPONENT

(71) Applicant: OSRAM Opto Semiconductors GmbH, Regensburg (DE)

(72) Inventors: Ion Stoll, Tegernheim (DE); Matthias Sabathil, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 838 days.

(21) Appl. No.: 14/403,702

(22) PCT Filed: May 28, 2013

(86) PCT No.: PCT/EP2013/060939
§ 371 (c)(1),
(2) Date: Nov. 25, 2014

(87) PCT Pub. No.: WO2013/178618
PCT Pub. Date: Dec. 5, 2013

(65) Prior Publication Data
US 2015/0122785 A1    May 7, 2015

(30) Foreign Application Priority Data
May 29, 2012  (DE) .......................... 10 2012 208 932

(51) Int. Cl.
*H05K 3/04*    (2006.01)
*H05K 3/02*    (2006.01)
(Continued)

(52) U.S. Cl.
CPC ............. *H05K 3/027* (2013.01); *C25D 13/00* (2013.01); *C25D 13/02* (2013.01); *C25D 13/04* (2013.01);
(Continued)

(58) Field of Classification Search
CPC ........ C25D 13/02; C25D 13/12; C25D 13/22; H05K 3/027; H05K 3/04; H01L 2933/0041; Y10T 29/5313; Y10T 83/0341
See application file for complete search history.

(56) References Cited

U.S. PATENT DOCUMENTS 5,466,358 A   11/1995  Kiyomiya et al.
6,924,233 B1   8/2005  Chua et al.
(Continued)

FOREIGN PATENT DOCUMENTS

CN    1617954     5/2005
CN    101460661   6/2009
(Continued)

OTHER PUBLICATIONS

English translation of a Notice to File a Response dated Feb. 29, 2016 of corresponding Korean Application No. 10-2014-7036760.
(Continued)

*Primary Examiner* — Savitr Mulpuri
(74) *Attorney, Agent, or Firm* — DLA Piper LLP (US)

(57) ABSTRACT

A process of producing a component includes providing a substrate having an electrically conductive surface in the form of an electrically conductive layer; subdividing the layer with the aid of a laser process into a first electrically autonomous region and a second electrically autonomous region, wherein an electrically insulating region is formed in the electrically conductive layer to electrically separate the electrically autonomous regions; forming an electrical potential difference between the first electrically autonomous region and the second electrically autonomous region; and applying an electrically charged substance or an electrically charged substance mixture onto the first electrically autonomous region and/or the second electrically autonomous region, wherein the electrically autonomous region and/or an amount of the applied electrically charged sub-
(Continued)

stance or of the electrically charged substance mixture are adjusted by the electrical potential difference.

11 Claims, 7 Drawing Sheets

(51) Int. Cl.
    *C25D 13/00*     (2006.01)
    *C25D 13/04*     (2006.01)
    *C25D 13/02*     (2006.01)
    *C25D 13/12*     (2006.01)
    *C25D 13/22*     (2006.01)

(52) U.S. Cl.
    CPC .............. *C25D 13/12* (2013.01); *C25D 13/22* (2013.01); *H05K 3/04* (2013.01); *H01L 2933/0041* (2013.01); *Y10T 29/5313* (2015.01); *Y10T 83/0341* (2015.04)

(56) References Cited

U.S. PATENT DOCUMENTS

| | | | | |
|---|---|---|---|---|
| 8,002,958 B2* | 8/2011 | Zhou | ................... | B82Y 30/00 |
| | | | | 204/486 |
| 8,202,747 B2* | 6/2012 | Liepold | ................... | C23C 24/08 |
| | | | | 438/22 |
| 8,969,893 B2* | 3/2015 | Kim | ................... | H01L 33/20 |
| | | | | 257/100 |
| 8,987,578 B2* | 3/2015 | Frazier | ................... | G21H 1/12 |
| | | | | 136/202 |
| 9,008,745 B2* | 4/2015 | Pushpala | ............ | G01N 27/3271 |
| | | | | 600/345 |
| 9,793,445 B2* | 10/2017 | Stoll | ................... | H01L 33/50 |
| 2002/0187571 A1* | 12/2002 | Collins, III | ............ | C25D 13/02 |
| | | | | 438/29 |
| 2006/0249388 A1 | 11/2006 | Chang et al. | | |
| 2008/0023332 A1* | 1/2008 | Webber | ................... | C25D 5/02 |
| | | | | 204/510 |
| 2015/0155446 A1* | 6/2015 | Stoll | ................... | B05B 5/005 |
| | | | | 438/29 |
| 2015/0270509 A1* | 9/2015 | Ingle | ................... | H01L 51/5253 |
| | | | | 438/26 |

FOREIGN PATENT DOCUMENTS

| | | |
|---|---|---|
| CN | 102237457 | 11/2011 |
| DE | 102 25 778 A1 | 4/2003 |
| EP | 2 105 976 | 9/2009 |
| JP | 06-076738 | 3/1994 |
| KR | 10-2010-0030666 | 3/2010 |

OTHER PUBLICATIONS

Chinese Office Action dated May 11, 2016, of corresponding Chinese Application No. 201380028747.1, along with an English translation.

* cited by examiner

PROCESS OF PRODUCING A COMPONENT AND APPARATUS THAT PRODUCES A COMPONENT

TECHNICAL FIELD

This disclosure relates to a process of producing a component and an apparatus that produces a component.

BACKGROUND

Formation of electromagnetic radiation of a second wavelength from electromagnetic radiation of a first wavelength is referred to as wavelength conversion. Wavelength conversion is used in optoelectronic components for color conversion, for example, to simplify generation of white light, for example, in white light-emitting diode flashlights or white light-emitting diode lamps. In this case, for example, blue light, for example, of a light-emitting diode (LED) is converted into green to red light. The color mixture of blue light and green to red light may form white light.

The wavelength conversion may, for example, be carried out by a luminophore formed in the light path of the optoelectronic component, for example, on or over the LED.

A luminophore may be understood as a substance which converts electromagnetic radiation of one wavelength into electromagnetic radiation of another (longer) wavelength with losses, for example, by phosphorescence or fluorescence. The energy difference between absorbed electromagnetic radiation and emitted electromagnetic radiation may be converted into phonons, i.e. heat, and/or by emission of electromagnetic radiation with a wavelength proportional to the energy difference.

Application of the luminophore on or over the optoelectronic component may, for example, be carried out by electrophoretic deposition. To this end, the optoelectronic component, for example, an LED in a package or on a panel may be electrically contacted and immersed in a suspension. The suspension may comprise phosphor particles suspended in a solvent. Phosphor particles may be understood as one type of luminophore. The electrically contacted optoelectronic component in this case forms an electrode. A further electrode may be formed at another position in the suspension. The further electrode may also be referred to as a back electrode.

The phosphor particles in the suspension may have an electric charge on the surface of the particles. The phosphor particles may thereby be moved in an electric field in the direction of the optoelectronic component and deposited as a phosphor layer on the optoelectronic component. The electric field may be formed by application of a potential difference between the electrically contacted optoelectronic component and the back electrode.

During the electrophoretic deposition, phosphor may be simultaneously deposited on all contacted electrically conductive regions of the surface of the optoelectronic component. No phosphor can therefore be deposited on or over electrically insulated surfaces of the optoelectronic component.

One conventional method of applying luminophores, for example, phosphor onto electrically insulated regions of the surfaces of optoelectronic components may be application of an electrically conductive layer onto the electrically insulated region of the surface of the optoelectronic component before the optoelectronic component is immersed in the suspension. To this end, thin metal layers, for example, aluminum layers with a thickness of 100 nm to 200 nm may conventionally be vapor-deposited or sputtered onto the surface of the optoelectronic component.

After electrophoretic deposition of the luminophore layer, for example, a phosphor layer onto the electrically conductive surface of the optoelectronic component, the aluminum may be wet-chemically removed from the surface of the optoelectronic component by an alkaline aqueous solution. The aluminum may be converted into an aluminum salt. The luminophore layer may remain behind on the surface of the optoelectronic component.

Application of the electrically conductive layer onto the surface of the optoelectronic component by vapor deposition or sputtering has, however, the effect that the entire electrically conductive surface is coated with luminophore. Coating of the entire metal-coated surface with luminophore is, however, desirable only for a few applications.

In one conventional method of structuring of the electrically conductive surface of the optoelectronic component, the electrically conductive layer may be structured photolithographically. To this end, before the electrically conductive layer is applied, a photoresist layer may be applied onto the surface of the optoelectronic component and subsequently exposed selectively by a photolithographic mask. The exposed or unexposed regions of the resist layer may then be removed wet-chemically depending on the resist.

The electrically conductive layer may subsequently be deposited on the surface of the optoelectronic component.

The electrically conductive layer on or over the resist layer may then be removed wet-chemically from the surface of the optoelectronic component by dissolving the resist.

The chemical properties of the photoresist and the electrically conductive layer should be formed such that the metal is not simultaneously dissolved with the photoresist. Otherwise, the metal on the regions of the surface of the optoelectronic component without photoresist could also be removed. The choice of available resists and electrically conductive layers may be restricted by the required compatibility of the solubility of the substances of the electrically conductive layer and the resist layer. Furthermore, the dimensions of the optoelectronic component should have only a small difference in relation to the dimension of the mask of the photolithographic process. Otherwise, regions of the surface of the optoelectronic component not meant to be structured could be structured, for example, regions configured as reflectors, overvoltage protection diodes, contact pads or as parts of the package.

In a plurality of optoelectronic components on a common carrier, for example, a panel, it is often not possible to achieve this small tolerance. In other words, the optoelectronic components on a panel may in total have an excessive difference in the dimensions. Photolithographic processes can therefore only limitedly be suitable and used for simultaneous structuring of an electrically conductive layer on or over a plurality of optoelectronic components.

In a further conventional method of structuring an electrically conductive layer, a mask, for example, a shadow mask is used in the particle beam when sputtering an electrically conductive layer on the surface of an optoelectronic component. In this way, an electrically conductive layer can be formed in the regions without a mask. That method may however be very inaccurate and may require different masks for different optoelectronic components.

It could therefore be helpful to provide a process of producing a component and an apparatus that produces a component with which it is possible to limit the electrophoretic deposition to defined regions of the surface of a component.

SUMMARY

We provide a process of producing a component including providing a substrate having an electrically conductive surface in the form of an electrically conductive layer; subdividing the layer with the aid of a laser process into a first electrically autonomous region and a second electrically autonomous region, wherein an electrically insulating region is formed in the electrically conductive layer to electrically separate the electrically autonomous regions; forming an electrical potential difference between the first electrically autonomous region and the second electrically autonomous region; and applying an electrically charged substance or an electrically charged substance mixture onto the first electrically autonomous region and/or the second electrically autonomous region, wherein the electrically autonomous region and/or an amount of the applied electrically charged substance or of the electrically charged substance mixture are adjusted by the electrical potential difference.

We also provide a process of producing a component including providing a substrate having an electrically conductive surface in the form of an electrically conductive layer; subdividing the layer with the aid of a scratching process into a first electrically autonomous region and a second electrically autonomous region, wherein an electrically insulating region is formed in the electrically conductive layer to electrically separate the electrically autonomous regions; forming an electrical potential difference between the first electrically autonomous region and the second electrically autonomous region; and applying an electrically charged substance or an electrically charged substance mixture onto the first electrically autonomous region and/or the second electrically autonomous region, wherein the electrically autonomous region and/or an amount of the applied electrically charged substance or of the electrically charged substance mixture are adjusted by the electrical potential difference.

We further provide an apparatus that produces a component including a substrate holder that holds a substrate comprising an electrically conductive surface, and the surface comprises a first electrically autonomous region and a second electrically autonomous region; a circuit that forms a first electrical potential difference between the first electrically autonomous region and the second electrically autonomous region; a device that applies an electrically charged substance or an electrically charged substance mixture onto the first electrically autonomous region or the second electrically autonomous region; and a control circuit that controls the electrically autonomous regions and/or an amount of the applied electrically charged substance or of the electrically charged substance mixture by the first electrical potential difference, wherein the control circuit controls formation of the electrical connection to the at least one electrically autonomous region by controlling the number of the electrically contacted electrically autonomous regions and/or the selection of the electrically contacted electrically autonomous regions.

DETAILED DESCRIPTION

Figure 1:
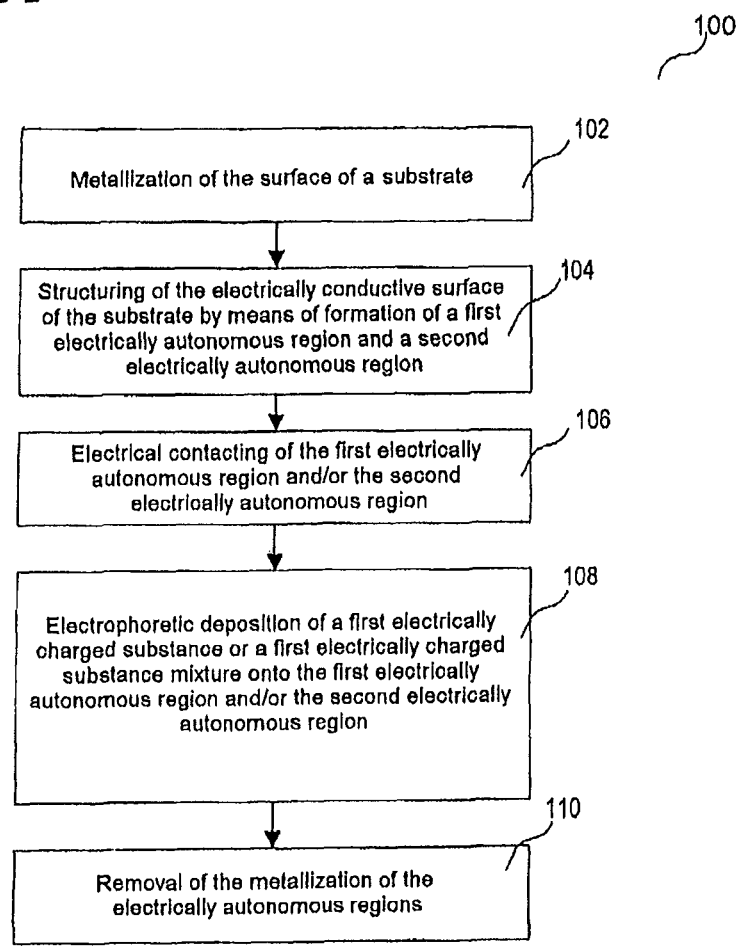
FIG. 1 shows a diagram of a process of producing a component according to various configurations.

An "organic substance" may be understood as a compound of carbon existing in chemically uniform form and distinguished by characteristic physical and chemical properties, regardless of the respective aggregate state. An "inorganic substance" may be understood as a compound without carbon, or a simple carbon compound, existing in chemically uniform form and distinguished by characteristic physical and chemical properties, regardless of the respective aggregate state. An "organic-inorganic substance" (hybrid substance) may be understood as a compound comprising compound parts which contain carbon and compound parts which are free of carbon, existing in chemically uniform form and distinguished by characteristic physical and chemical properties, regardless of the respective aggregate state. The term "substance" comprises all substances mentioned above, for example, an organic substance, an inorganic substance and/or a hybrid substance. Furthermore, a substance mixture may be understood as something that consists of constituents of two or more different substances, the constituents of which are for example very finely distributed. A substance class is to be understood as a substance or a substance mixture consisting of one or more organic substances, one or more inorganic substances or one or more hybrid substances. The term "material" may be used synonymously with the term "substance".

A "charged substance" may be understood as a substance which has an electric charge, i.e. is at least temporarily, not electrically, neutral. The electric charge may be formed by polarization or ionization.

The charged substance may, for example, be formed as particles.

A process of producing a component is provided. The process may comprise: provision of a substrate having an electrically conductive surface; wherein the surface comprises a first electrically autonomous region and a second electrically autonomous region; formation of an electrical potential difference between the first electrically autonomous region and the second electrically autonomous region and application of an electrically charged substance or an electrically charged substance mixture onto the first electrically autonomous region and/or the second electrically autonomous region; wherein the electrically autonomous region and/or the amount of the applied electrically charged substance or of the electrically charged substance mixture are adjusted by the electrical potential difference.

The provision of the substrate having an electrically conductive surface may comprise formation of an electrically conductive layer on or over an electrically insulating surface of the substrate.

The electrically conductive layer may comprise an organic substance, an inorganic substance or an organic-inorganic hybrid substance, or be formed therefrom.

An electrically conductive layer of an inorganic substance may comprise as its substance a substance from the group of substances: iron, steel, aluminum, copper, silver, gold, palladium, magnesium, titanium, platinum, nickel, tin, zinc, silicon, germanium, α-tin, boron, selenium, tellurium, indium, gallium, arsenic, phosphorus, antimony, zinc, cadmium, beryllium, or be formed therefrom, and be formed for example as an aluminum layer or indium tin oxide (ITO) layer.

An electrically conductive layer of an organic substance may comprise as its substance a substance from the group of substances: tetracene, pentacene, phthalocyanines, polythiophene, PTCDA, MePTCDI, quinacridone, acridone, indanthrone, flavanthrone, perinone, Alq3, or be formed therefrom.

An electrically conductive layer of an organic-inorganic hybrid substance may comprise as its substance a substance from the group of substances: polyvinyl carbazole, TCNQ complexes, or be formed therefrom.

Selection of the substance or the substance mixture of the electrically conductive layer may be carried out with the aid of the specific component and compatibility of the removal of the electrically conductive layer and the electrically charged substance to be applied, for example, compatibility of the carrier, the luminophore and/or the other parts of the component with an aqueous alkaline solution, or also a different solvent in organic substances or hybrid substances.

The electrically conductive layer may have a thickness of approximately 20 nm to approximately 500 μm.

The electrically conductive layer may be applied on all regions of the surface of the substrate.

The electrically conductive substance may, for example, be vapor-deposited or sputtered onto the surface of the substrate.

Before formation of the electrically conductive layer, the surface of the substrate may already comprise regions which are electrically conductive, for example, contact pads. Before formation of the electrically conductive layer on the surface of the substrate, an electrically insulating layer may therefore be formed on the surface of the substrate. In other words: a fully electrically insulating surface may be formed on the surface of the substrate.

The electrically insulating surface of the substrate may be formed by formation of an electrically insulating layer on or over a partially or fully electrically insulating surface of the substrate.

During the subsequently carried out formation of the electrically insulating region between the electrically autonomous regions, an electrical short circuit could otherwise occur with electrically conductive regions on the surface of the substrate in physical contact with the electrically conductive layer, i.e. formation of an electrically autonomous region could be hindered without the electrically insulating layer on the only partially electrically insulating substrate surfaces.

The electrically insulating layer may, for example, comprise $SiO_2$ or $Al_2O_3$ or be formed therefrom. The electrically insulating layer may however also comprise a different insulating metal oxide, semimetal oxide, metal nitride and/or semimetal nitride, or be formed therefrom.

The electrically insulating layer may, however, also comprise an electrically insulating polymer and/or a silicone, or be formed therefrom.

The substance or the substance mixture of the electrically insulating layer may, for example, be vapor-deposited or sputtered onto the surface of the substrate.

The substrate may comprise a carrier and at least one electronic component, for example, a diode or, for example, an optoelectronic component, for example, a light-emitting diode, an organic light-emitting diode, a solar cell or a photodetector.

In other words: the substrate may be understood as a component which may comprise a carrier with one or more electronic components, for example, optoelectronic components, for example, light-emitting diode, for example, a GaN diode, an InGaN diodes or an InGaAlP diode.

The carrier may, for example, be a panel, chip wafer or a lead frame.

The substrate may, however, also be understood as a component with a carrier without an electronic component, for example, as a package.

Provision of the substrate may comprise formation of the electrically autonomous regions, wherein formation of the electrically autonomous regions comprises formation of an electrically insulating region in the surface of the electrically conductive substrate, in the region between the electrically autonomous regions.

The shape of the electrically insulating region and the electrically autonomous regions in the electrically conductive surface of the substrate, for example, of the electrically conductive layer may, for example, be adapted to the shape of the structures below the electrically conductive layer, for example, the shape of an electronic component on a carrier and may, for example, be approximately congruent.

Formation of the electrically insulating region between the electrically autonomous regions may comprise removal of the electrically conductive surface of the substrate, for example, of the electrically conductive layer, in the region of the electrically insulating region.

Formation of the electrically insulating region may comprise mechanical removal of the substance or substance mixture of the electrically conductive surface, for example, scratching.

Scratching of the electrically conductive surface may, for example, be carried out with a sharp apparatus. The sharp apparatus may, for example, comprise a diamond or be formed therefrom in which case the sharp apparatus may be moved with computer control.

Formation of the electrically insulating region may comprise ballistic removal of the substance or substance mixture of the electrically conductive surface, for example, of the electrically conductive layer, for example, bombardment with particles, molecules, atoms, ions, electrons and or photons, for example, laser ablation.

Bombardment of the electrically conductive surface with photons may for example, be configured as laser ablation or laser desorption with a laser having a wavelength of approximately 200 nm to approximately 1500 nm, for example, focused with a focal diameter of approximately 10 μm to approximately 2000 μm, for example, with a power of approximately 50 mW to approximately 1000 mW, for example, with a power density of 100 $kW/cm^2$ to approximately 10 $GW/cm^2$, for example, as a continuous-wave laser or, for example, as a pulsed laser, for example, with a pulse duration of approximately 100 fs to approximately 0.5 ms and, for example, with a repetition rate of approximately 100 Hz to approximately 1000 Hz.

Formation of the electrically insulating region between the electrically autonomous regions may comprise chemical crosslinking or chemical degradation of the electrically conductive surface of the substrate, for example, of the electrically conductive layer.

Chemical crosslinking or degradation of an organic or organic-inorganic electrically conductive layer may, for example, comprise breaking of multiple bonds or a ring-opening reaction and/or chemical addition, chemical elimination, chemical substitution or chemical rearrangement, for example, by UV radiation.

The electrically insulating region may comprise a gas, for example, air or an electrically insulating polymer, for example, an electrically conductive polymer rendered electrically insulating by UV radiation.

Formation of the potential difference between the first electrically autonomous region and the second electrically autonomous region may comprise the connection of at least one electrically autonomous region to a voltage source or, in other words: it may comprise formation of at least one first electrode from the component.

The voltage source may form a static or time-modulated voltage at the first electrode, for example, a voltage pulsed as a function of time.

Formation of the potential difference between the first electrically autonomous region and the second electrically autonomous region may comprise electrostatic charging of at least one region.

The electrical potential difference may formed such that electrically charged particles of an electrically charged substance or electrically charged substance mixture can only accumulate on one of the electrically autonomous regions of the electrically conductive surface of the substrate, for example, of the electrically conductive layer.

In positively electrically charged particles, the first electrically autonomous region may, for example, have a negative electric charge and the second electrically autonomous region may, for example, have no electric charge. Wherein in this configuration the electrically charged substance or the electrically charged substance mixture is formed as particles and is electrically attracted by the first electrically autonomous region.

Instead of no electric charge, the second electrically autonomous region may however also have a positive electric charge, i.e. the positively electrically charged particles are also repelled electrostatically by the positively electrically charged second electrically autonomous regions, in addition to the attraction by the first electrically autonomous region.

The voltage source may, for example, have a voltage value of approximately −1000 V to approximately +1000 V.

The first electrically charged substance or the first electrically charged substance mixture may be dissolved in a first solvent and form a first suspension.

To apply the first electrically charged substance or the first electrically charged substance mixture onto the first electrically autonomous region or the second electrically autonomous region, physical contact of the first electrically autonomous region and/or the second electrically autonomous region with the first suspension may be formed, wherein a second electrode may be configured in the first suspension.

In other words: After formation of the potential difference between the electrically autonomous regions, the substrate may be immersed in a suspension consisting of a first solvent and a first electrically charged substance or a first electrically charged substance mixture in which case the first charged substance or the first electrically charged substance mixture may be formed as particles, for example, as first luminophore particles.

In addition, a back electrode may be immersed in the first suspension. The electric charge of the first electrically charged substance or first electrically charged substance mixture may also not be established until by a voltage applied via the electrodes.

The electric fields between the electrodes, i.e. between the electrically autonomous regions and the back electrode and/or between the electrically autonomous regions, may permit electrophoretic deposition of the first electrically charged particles of the first suspension. In this way, a first electrophoretic layer may be formed on the first electrically autonomous region and/or the second electrically autonomous region, for example, as a first luminophore layer. The electric field between the component and the back electrode in the suspension may permit extensive electrophoretic deposition onto the electrically autonomous regions. Electrophoretic deposition may be formed only on the electrically autonomous region on which the electrical potential is configured such that the electrically charged particles can be deposited, and for example are not electrostatically repelled. The electrically charged particles may therefore, for example, not be deposited in the electrically insulating region between the first electrically autonomous region and the second electrically autonomous region. In this way, well-defined transitions, i.e. interfaces, of the electrophoretic layers in the region of the electrically autonomous regions may be formed.

The first electrically charged particles may, for example, comprise a luminophore or be formed therefrom. The luminophore may comprise as the first electrically charged substance or first electrically charged substance mixture a substance from the group of substances: $Ce^{3+}$-doped garnets such as YAG:Ce and LuAG, for example $(Y,Lu)_3(Al,Ga)_5O_{12}:Ce^{3+}$; $Eu^{2+}$-doped nitrides, for example $CaAlSiN_3:Eu^{2+}$, $(Ba,Sr)_2Si_5N_8:Eu^{2+}$; $Eu^{2+}$-doped sulfides, SIONs, SiAlON, orthosilicates, for example $(Ba,Sr)_2SiO_4:Eu^{2+}$; chlorosilicates, chlorophosphates, BAM (barium magnesium aluminate:Eu) and/or SCAP, halophosphate, or be formed therefrom.

The first electrically charged particles may, however, also comprise a different electrically charged substance or stoichiometric compounds thereof, or be formed therefrom, for example, a substance reflecting electromagnetic radiation and/or a substance scattering electromagnetic radiation, for example, $TiO_2$, $Al_2O_3$, $ZrO_2$, $SiO_2$, Au or the like.

The second electrode may comprise the first electrically charged substance or the first electrically charged substance mixture as its substance or substance mixture, the first electrically charged substance or the first electrically charged substance mixture being dissolved, i.e. electrolytically etched free, in the suspension by means of the potential difference between the first electrode and the second electrode.

After application of the first electrically charged substance or the first electrically charged substance mixture onto the first electrically autonomous region or the second electrically autonomous region, a second electrically charged substance or a second electrically charged substance mixture may be applied on or over the first electrically autonomous region or the second electrically autonomous region.

Further electrically charged substances or further electrically charged substance mixtures may be applied on or over the first electrically autonomous region or the second electrically autonomous region.

Further application of a second or further electrically charged substance or of an electrically charged substance mixture may comprise modification of one or more parameters from the group of parameters: the electrical potential difference; the electrically charged substance or the electrically charged substance mixture; the solvent of the suspension; and/or the layer thickness of the applied further electrically charged substance or electrically charged substance mixture.

The process may furthermore comprise removal of the electrically conductive layer, for example, wet chemical removal, for example, by an aqueous alkaline solution, for example, an aqueous potassium hydroxide solution.

The component may be formed with at least one wavelength-converted optoelectronic component, for example, a wavelength-converted light-emitting diode.

The component may be formed with a plurality of wavelength-converted optoelectronic components as a multicolor emitting or absorbing optoelectronic component, for example, a multicolor light-emitting diode or a multicolor absorbing solar cell.

A luminophore may be applied onto the first electrically autonomous region and a reflector may be applied onto the second electronically autonomous region.

An apparatus that produces a component is provided. The apparatus may comprise: a substrate holder, wherein the substrate comprises an electrically conductive surface, wherein the surface comprises a first electrically autonomous region and a second electrically autonomous region; a circuit that forms a first electrical potential difference between the first electrically autonomous region and the second electrically autonomous region; a device that applies an electrically charged substance or an electrically charged substance mixture onto the first electrically autonomous region and/or the second electrically autonomous region; a control circuit that controls the electrically autonomous regions and/or the amount of the applied electrically charged substance or of the electrically charged substance mixture by the first electrical potential difference.

The substrate holder may be configured such that flat substrates and/or geometrically curved substrates are fixed during the process.

The substrate holder may comprise electrical terminals, the electrical terminals being configured such that at least one electrically autonomous region electrically connects to the circuit to form a first electrical potential difference, the at least one electrically connected electrically autonomous region forming a first electrode by the electrical connection.

The circuit that forms the first electrical potential difference may comprise at least one voltage source, the at least one voltage source being configured to form at least one electrical potential difference.

The circuit that forms the first electrical potential difference may be configured such that the at least one voltage source is electrically connected by an electrical connection to at least one electrically autonomous region, for example, by a clamp.

The circuit that forms the first electrical potential difference may be configured such that the control circuit controls the flow of current between the at least one voltage source and the at least one electrically connected electrically autonomous region.

The control circuit may control the time profile of the first electrical potential difference between two or more electrically autonomous region.

The control circuit may set up a first electrical potential difference between the first electrically autonomous region and the second electrically autonomous region, which is constant as a function of time.

The control circuit may set up a time-variant first electrical potential difference between the first electrically autonomous region and the second electrically autonomous region.

The first electrical potential difference may be pulsed as a function of time.

The device that applies an electrically charged substance or electrically charged substance mixture may comprise a container with a suspension and a second electrode, the suspension and the second electrode being arranged inside the container.

The container may comprise the second electrode or be configured as a second electrode.

The container may be grounded.

The circuit that forms the first electrical potential difference may be configured such that a second electrical potential difference is formed between the first electrode and the second electrode.

The second electrode may comprise the substance or substance mixture of the first electrically charged substance or the first electrically charged substance mixture, or be formed therefrom.

The second electrode may be configured such that the substance or the substance mixture of the first electrically charged substance or the first electrically charged substance mixture is dissolved in the suspension by means of a second electrical potential difference between the first electrode and the second electrode.

The suspension may comprise the substance or the substance mixture of the first electrically charged substance or the first electrically charged substance mixture, or be formed therefrom.

The container may be configured such that the at least one electrically autonomous region of the substrate, which electrically connects to the circuit that forms an electrical potential difference, is fully surrounded by the suspension in the container, the substrate being fixed in the suspension by the substrate holder.

The control circuit may be configured such that the control circuit controls the second electrical potential difference between the first electrode and the second electrode.

The control circuit may set up a second electrical potential difference between the first electrode and the second electrode which is constant as a function of time.

The control circuit may set up a time-variant second electrical potential difference between the first electrode and the second electrode.

The second electrical potential difference may be pulsed as a function of time.

The control circuit may be configured such that the time profile of the second electrical potential difference is coupled with the time profile of the first electrical potential difference.

The substrate holder may be configured such that the electrical connection of the electrical terminals of the substrate holder to the electrically autonomous regions of the substrate is formed electrically, for example, by opening and closing clamps.

The control circuit may control formation of the electrical connections of the electrical terminals of the substrate holder to the at least one electrically autonomous region, for example, the number of the electrically contacted electrically autonomous regions and/or the selection of the electrically contacted electrically autonomous regions.

The apparatus may be configured to form a luminophore layer and/or a reflector layer on or over an optoelectronic component.

Examples of our methods and apparatus are represented in the figures and will be explained in more detail below.

Turning now to the appended drawings, which form part of this description and in which specific examples in which our methods and apparatus may be implemented are shown for illustration. In this regard, direction terminology such as "up", "down", "forward", "backward", "front", "rear", etc. is used with reference to the orientation of the figure or figures being described. Since components of examples can be positioned in a number of different orientations, the direction terminology is used for illustration and is in no way restrictive. It is to be understood that other examples may be used and structural or logical modifications may be carried out, without departing from the protective scope of this disclosure. It is to be understood that the features of the various examples described herein may be combined with one another, unless specifically indicated otherwise. The following detailed description is therefore not to be interpreted in a restrictive sense, and the protective scope of this disclosure is defined by the appended claims.

Terms such as "connected" or "coupled" are used to describe both direct and indirect connection, and direct or indirect coupling. In the figures, elements which are identical or similar are provided with identical references, insofar as this is expedient.

FIG. 1 shows a diagram of a process of producing a component according to various configurations.

The process may comprise application of an electrically conductive layer on or over a substrate. The electrically conductive layer may comprise an organic substance, an inorganic substance or an organic-inorganic substance, or be formed therefrom. Application of an electrically conductive layer onto a substrate may be understood as metallization 102 of a substrate, without thereby making a restriction in respect of the substance selection of the electrically conductive layer, i.e., a substrate may also be "metallized" with an organic electrically conductive substance.

An electrically conductive layer of an inorganic substance may comprise as its substance a substance from the group of substances: iron, steel, aluminum, copper, silver, gold, palladium, magnesium, titanium, platinum, nickel, tin, zinc, silicon, germanium, α-tin, boron, selenium, tellurium, indium, gallium, arsenic, phosphorus, antimony, zinc, cadmium, beryllium, or be formed therefrom, and formed for example as an aluminum layer or indium tin oxide (ITO) layer.

An electrically conductive layer of an organic substance may comprise as its substance a substance from the group of substances: tetracene, pentacene, phthalocyanines, polythiophene, PTCDA, MePTCDI, quinacridone, acridone, indanthrone, flavanthrone, perinone, Alq3, or be formed therefrom.

An electrically conductive layer of an organic-inorganic hybrid substance may comprise as its substance a substance from the group of substances: polyvinyl carbazole, TCNQ complexes, or be formed therefrom.

Selection of the substance or the substance mixture of the electrically conductive layer may be carried out with the aid of the specific component and the compatibility of the removal of the electrically conductive layer with the component, for example, the compatibility of the carrier, the luminophore and/or other system components with an aqueous alkaline solution.

The substrate may be understood as a component which may comprise a carrier with one or more electronic component, for example, diodes or, for example, optoelectronic components, for example, a light-emitting diode, for example, a GaN diode, an InGaN diode or an InGaAlP diode. The substrate may, however, also be understood as a component with a carrier without an electronic component, for example, a package.

The electrically conductive layer may have a thickness of approximately 20 nm to approximately 500 µm.

The electrically conductive layer may be applied on all regions of the surface of the substrate.

The electrically conductive substance may, for example, be vapor-deposited or deposited (for example sputtered) or even, for example, sprayed, onto the surface of the substrate.

Before metallization 102, the surface of the substrate may already comprise electrically conductive regions. Before metallization 102 of the surface of the substrate, an electrically insulating layer may therefore be formed on the surface of the substrate. The electrically insulating layer may, for example, comprise $SiO_2$ or $Al_2O_3$ or be formed therefrom. The substance or the substance mixture of the insulating layer may be vapor-deposited or sputtered onto the surface of the substrate.

Before metallization 102 of the substrate, the electrically conductive regions of the substrate may be electrically insulated by the electrically insulating layer, from the electrically conductive layer formed on the surface of the substrate by metallization 102.

In a next step, the process may comprise structuring 104 the electrically conductive layer after metallization 102 of the surface of the substrate.

During structuring 104 of the electrically conductive layer, the electrically conductive layer may be removed from regions of the surface of the substrate such that electrically independent regions are formed in the electrically conductive surface, for example, of the electrically conductive layer. Electrically independent regions in the electrically conductive layer may, for example, be produced by removing the electrically conductive layer between two electrically independent regions. The electrically independent regions may therefore also be understood as electrically autonomous regions, i.e. no electrical connection is formed between the electrically independent regions, or electrically autonomous regions.

The shape of the electrically autonomous regions of the electrically conductive layer may be adapted to the structures below the electrically conductive layer, on the surface of the substrate. For example, the shape of the electrically autonomous regions of the electrically conductive layer may be adapted to the shape of optoelectronic components, for example, to the shape of InGaN diodes on a panel or a lead frame as the substrate of the electrically conductive layer.

Structuring 104 of the electrically conductive layer may, for example, comprise a mechanical process and/or a ballistic process.

A mechanical process may, for example, be formed as scratching of the electrically conductive surface, for example, of the electrically conductive layer with a sharp apparatus in which case the sharp apparatus may be moved with computer control.

A ballistic process may, for example, comprise bombardment of the electrically conductive surface, for example of the electrically conductive layer with particles, molecules, atoms, ions, electrons and or photons, for example laser ablation or laser desorption of the electrically conductive layer.

Laser ablation may, for example, be carried out with a laser which has a wavelength of approximately 200 nm to approximately 1500 nm and is, for example, focused with a focal diameter of approximately 10 µm to approximately 2000 µm, for example, with a power of approximately 50 mW to approximately 1000 mW, for example, with a power density of 100 kW/cm$^2$ to approximately 10 GW/cm$^2$, for example, as a continuous-wave laser or, for example, as a pulsed laser, for example, with a pulse duration of approximately 100 fs to approximately 0.5 ms and, for example, a repetition rate of approximately 100 Hz to approximately 1000 Hz.

Formation of the electrically insulating region between the electrically autonomous regions may comprise chemical crosslinking or chemical degradation of the electrically conductive surface of the substrate, for example, of the electrically conductive layer, for example, of an organic electrically conductive substance.

The chemical crosslinking or degradation may, for example, comprise breaking of multiple bonds or a ring-opening reaction, and lead to chemical addition, chemical elimination, chemical substitution and/or chemical rearrangement, for example, by UV radiation.

The electrically insulating region may comprise a gas, for example, air or an electrically insulating polymer.

After structuring 104 of the electrically conductive layer, the process may comprise first electrical contacting 106 of the electrically autonomous regions, for example, of the electrically conductive layer.

By the fully insulating surface of the substrate under the electrically conductive layer, and at least one electrically insulating region between the electrically autonomous regions of the electrically conductive layer, no electrical connection can be formed between the electrically autonomous regions.

In other words: the first electrically autonomous region can be electrically insulated from the second electrically autonomous region in the direction of the substrate by means of the electrically insulating surface of the substrate and laterally by means of the at least one electrically insulating region. A flow of current between the electrically autonomous regions can therefore no longer be possible.

In this way, the electrically autonomous regions can be electrically contacted independently of one another. The first electrical contacting 106 of the electrically conductive layer can therefore be understood as electrical contacting 106 of at least one electrically autonomous region.

The first electrical contacting 106 may comprise the electrical connection of the electrically autonomous regions to a voltage source or a plurality of voltage sources.

The electrically contacted electrically autonomous regions may have an electrical potential difference with respect to a back electrode, for example in a suspension.

The electrical potential difference may be formed such that electrically charged particles can accumulate only on one of the electrically autonomous regions, or on a plurality of electrically autonomous regions, but at a different rate.

A first electrical potential difference may be understood as a potential difference between two electrically autonomous regions. The first electrical potential difference may comprise electrical contacting 106 of the first electrically autonomous region and/or of the second electrically autonomous region.

The simultaneously electrically contacted electrically autonomous regions may or may not have an electrical potential difference between one another.

More than two electrically autonomous regions may be formed on the surface of a substrate. Of the more than two electrically autonomous regions, at least two electrically autonomous regions may be electrically contacted simultaneously. The simultaneously electrically contacted electrically autonomous regions may in this case not have an electrical potential difference between one another.

The simultaneously electrically contacted electrically autonomous regions without an electrical potential difference between one another may, be understood as a first electrically autonomous region. The not electrically contacted electrically autonomous regions may, accordingly, be understood as a second electrically autonomous region.

The two or more simultaneously electrically contacted electrically autonomous regions without an electrical potential difference between one another may, for example, be formed on different regions of the surface of the substrate. On or over these regions, at different positions of the surface of the substrate, the same first electrically charged substance or the same first electrically charged substance mixture, for example, may be formed with the same layer thickness.

An electrical potential difference of the simultaneously electrically contacted electrically autonomous regions between one another may form a different rate of the electrophoretic deposition with respect to a back electrode. In this way, different thicknesses of the electrophoretically deposited layers may be produced on the simultaneously electrically contacted electrically autonomous regions with an electrical potential difference between one another.

The electrical potential difference of the electrically autonomous regions between one another may, however, with respect to the electrophoretic deposition, also be configured for selection of an electrically autonomous region of the simultaneously electrically contacted electrically autonomous regions.

In positively electrically charged particles, the first electrically autonomous region may, for example, have a negative electric charge and the second electrically autonomous region may have no electric charge. The positively electrically charged particles can then be electrically attracted by the first electrically autonomous region.

Instead of no electric charge, the second electrically autonomous region may however also have a positive electric charge, i.e. the positively electrically charged particles are, in addition, repelled electrostatically by the positively electrically charged second electrically autonomous region.

The voltage source may have a voltage value of approximately −1000 V to approximately +1000 V.

After the first electrical contacting 106 of the electrically autonomous regions, for example, of the electrically conductive layer the substrate may be immersed in a first suspension. The suspension may comprise a first solvent and a first electrically charged substance or a first electrically charged substance mixture, or be formed therefrom. The first electrically charged substance or the first electrically charged substance mixture may, for example, be formed as electrically charged particles. The first suspension may, for example, comprise a first luminophore. In addition, a back electrode may be immersed in the first suspension.

As a function of the electrical potential of electrically autonomous regions of the electrically conductive layer, first electrophoretic deposition 108 of the first charged particles of the first suspension may take place to form a first electrophoretic layer on one of the electrically autonomous regions of the electrically conductive layer, for example, as a first luminophore layer.

First electrophoretic deposition 108 may be formed only on the electrically autonomous regions of the electrically conductive layer on which the electrical potential is configured such that the first electrically charged particles can be deposited on the electrically autonomous region. The first electrically charged particles may therefore, for example, not be deposited in the electrically insulating region between the electrically autonomous regions.

First electrophoretic deposition 108 may, however, also be formed simultaneously on both electrically autonomous regions. The potential difference between the electrically autonomous regions may be formed such that different electrophoretic diffusion rates of the first electrically charged particles are formed during the first electrophoretic deposition 108. In this way, electrophoretic layers which are materially the same, but which have different layer thicknesses, can be formed simultaneously on the electrically autonomous regions.

The first electrically charged particles may, for example, comprise a luminophore or be formed therefrom. The luminophore may comprise as its substance or substance mixture a substance from the group of substances: $Ce^{3+}$-doped garnets such as YAG:Ce and LuAG, for example, $(Y,Lu)_3(Al,Ga)_5O_{12}:Ce^{3+}$; $Eu^{2+}$-doped nitrides, for example, $CaAlSiN_3:Eu^{2+}$, $(Ba,Sr)_2Si_5N_8:Eu^{2+}$; $Eu^{2+}$-doped sulfides, SIONs, SiAlON, orthosilicates, for example, $(Ba,Sr)_2SiO_4:Eu^{2+}$; chlorosilicates, chlorophosphates, BAM (barium magnesium aluminate:Eu) and/or SCAP, halophosphate, or be formed therefrom.

The first electrically charged particles may, however, also comprise a different electrically charged substance or be formed therefrom, for example, a reflecting substance and/or a scattering substance, for example, $TiO_2$, $Al_2O_3$, $ZrO_2$, $SiO_2$, Au or the like.

The first solvent of the first suspension may comprise as its substance or substance mixture a substance from the group of substances: water, an alcohol, a ketone, an aldehyde, an aromatic and/or aliphatic hydrocarbon, an amine, a dimethyl sulfoxide, or be formed therefrom.

After the first electrophoretic deposition 108 of the first luminophore layer on the electrically conductive layer on the surface of the substrate, the process may comprise removal 110 of the electrically conductive layer, if the substrate has been metallized (102) beforehand. Removal 110 of the electrically conductive layer may, for example, comprise wet chemical removal of the electrically conductive layer from the surface of the substrate, for example, with an alkaline aqueous solution, for example, a potassium hydroxide solution. The metal may be converted into a metal salt, and the luminophore layer may remain on the surface of the substrate. What is essential for this may be a different solubility of the substance of the electrically conductive layer compared with the solubility of the substance of the electrophoretic layer.

Figure 2:
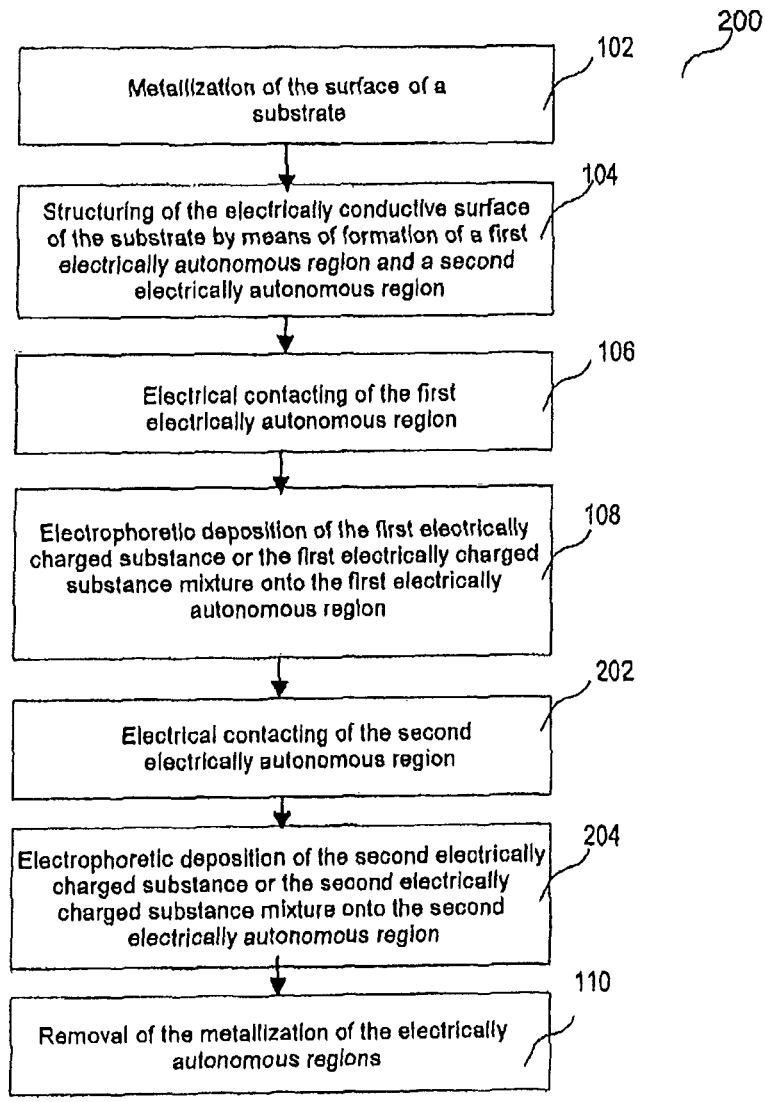
FIG. 2 shows a diagram of a process of producing a component according to various configurations.

FIG. 2 shows a diagram of a process of producing a component according to various configurations.

In contrast to the process according to the description of FIG. 1, in other configurations, the process may comprise at least one further electrophoretic deposition 204 of an electrically charged substance or substance mixture on the surface of the substrate. The further electrophoretic deposition 204 may be configured before removal of the metallization 110, in which case, for example, the surface of the substrate may comprise only one structuring 104 of the electrically conductive layer.

After the first electrophoretic deposition 106, the electrical potential difference of the electrically autonomous regions of the electrically conductive layer may be modified, for example, by the electrically autonomous regions which was not connected to the voltage source during the first electrical contacting 106 being electrically connected to a voltage source during second electrical contacting 202 of electrically autonomous regions.

In a second electrophoretic deposition 204 in a second suspension, a second electrophoretic layer may then be formed on electrically autonomous regions of the electrically conductive surface of the substrate. In this way, further electrically autonomous regions of the surface of the substrate may be coated in addition to the electrically autonomous region of the configurations of FIG. 1. The second suspension may in this case comprise a second type of electrically charged particles and a second solvent.

The second solvent may be configured to be materially similar to or the same as the first solvent.

The second electrically charged particles may be formed in the same way as the first electrically charged particles, for example, when a first electrophoretic layer with regions of different layer thickness is intended to be formed on the substrate.

The second electrically charged particles may, however, also, for example, comprise a different luminophore than the first electrically charged particles. The second electrically charged luminophore particles may in this case comprise as their substance or substance mixture a substance from the group of substances: $Ce^{3+}$-doped garnets such as YAG:Ce and LuAG, for example, $(Y,Lu)_3(Al,Ga)_5O_{12}:Ce^{3+}$; $Eu^{2+}$-doped nitrides, for example $CaAlSiN_3:Eu^{2+}$, $(Ba,Sr)_2Si_5N_8:Eu^{2+}$; $Eu^{2+}$-doped sulfides, SIONs, SiAlON, orthosilicates, for example $(Ba,Sr)_2SiO_4:Eu^{2+}$; chlorosilicates, chlorophosphates, BAM (barium magnesium aluminate:Eu) and/or SCAP, halophosphate, or be formed therefrom.

The second electrically charged particles may, however, also comprise a different electrically charged substance or be formed therefrom, for example, a reflecting and/or scattering substance, for example, $TiO_2$, $Al_2O_3$, $ZrO_2$, $SiO_2$, Au or the like.

After the second electrophoretic deposition 204 or further electrophoretic deposition 204, the removal of the electrically conductive layer 110 may be carried out.

With two or more electrophoretic deposition processes, different structures can be formed on the substrate by means of structuring 104 and removal 110 of the electrically conductive layer. For example, the surface may comprise two or more different types of luminophore layer regions after the process. In addition or as an alternative, the surface may comprise a reflector layer between the luminophore layer regions. Then, for example, the electromagnetic radiation emitted by the luminophore layers in the direction of the substrate can be reflected by the reflector layer.

One type of luminophore layer region may be understood as a laterally bounded region on the surface of the substrate, the region comprising a layer with one type of luminophore.

Two or more different types of luminophore layer regions on a substrate may be configured to form a multi-LED, for example, a multichip LED as a mixture of a phosphor-converted chip, for example, mint-colored, and a non-phosphor-converted chip, for example, preferably red.

Figure 3:
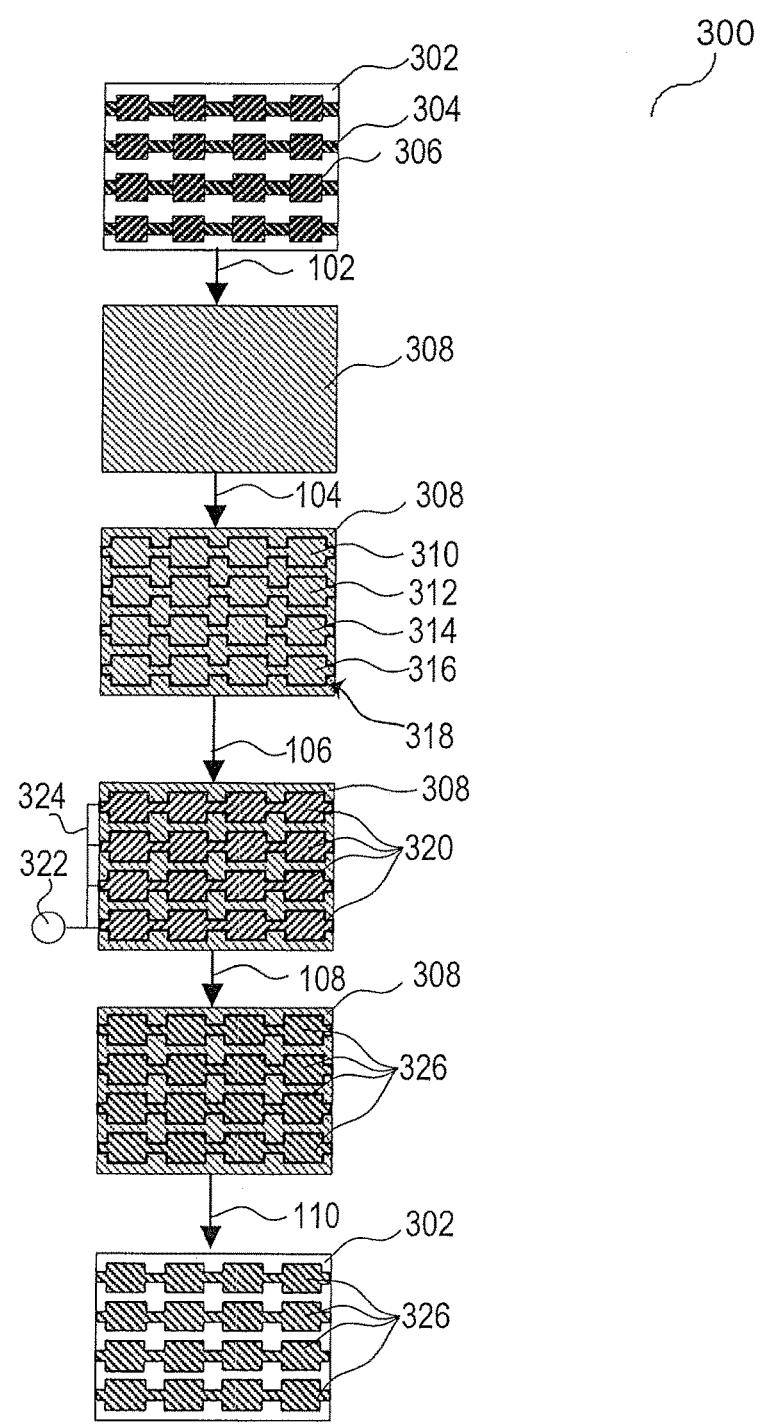
FIG. 3 shows a schematic plan view of a component in the process of producing a component according to one configuration.

FIG. 3 shows a schematic plan view of a component in the process of producing a component according to one configuration.

In the process of producing a component, a configuration 300 of a component according to the description of FIG. 1 is represented schematically.

Without restriction of generality, FIG. 3 represents a configuration of a component, the component comprising a carrier 302, and a plurality of optoelectronic components 306 being formed on the carrier 302. The optoelectronic components 306 may be partially electrically connected to one another by electrical connections 304.

A part of the surface of the substrate 300, for example, the electrical connections may be electrically conductive.

The optoelectronic components 306 may, for example, be configured as InGaN diodes.

Before metallization 102 of the substrate, an electrically insulating layer (not represented), for example, an $SiO_2$ layer with a thickness of approximately 20 nm, should therefore be applied onto the surface of the substrate.

Subsequently, by metallization 102, an electrically conductive layer 308, for example, an indium tin oxide layer 308, or ITO layer 308, with a thickness of approximately 100 nm may be applied onto the surface of the substrate.

By structuring 104, a part 318 of the metal layer 308 may be removed so that the electrically insulating layer is exposed.

By structuring 104, electrically autonomous regions 308, 310, 312, 314, 316 may be formed in the electrically conductive layer 308. The electrically autonomous regions 310, 312, 314, 316 may, for example, be formed over or on the optoelectronic components 306 and electrical connections 304.

The electrical contacting 106 of the electrically autonomous regions 310, 312, 314, 316 may, for example, permit formation of a first electrical potential difference 320 between the electrically autonomous regions 310, 312, 314, 316 and the electrically conductive layer 308.

The first electrical potential difference 320 may be generated by a voltage source 322 electrically connected by electrical terminals 324 to the electrically autonomous regions 310, 312, 314, 316.

The voltage source 322 may, for example, have a static voltage value of approximately 400 V.

After electrical contacting 106, the substrate 300 may be immersed in a luminophore suspension having a back electrode. This may lead to electrophoretic deposition 108 of the luminophore 326 on the structured electrically independent regions 310, 312, 314, 316.

The luminophore suspension may, for example, be an aqueous solution of YAG, with a proportion by mass of the luminophore to the suspension of approximately 10%.

According to the description of FIG. 2, the deposited luminophore 326 may also be referred to as a first electrophoretic layer 326.

After the electrophoretic deposition 108 of the luminophore 326, the electrically conductive layer 308 may be removed (110) wet-chemically, for example by means of an aqueous potassium hydroxide solution. The aqueous potassium hydroxide solution may have a proportion by mass of potassium hydroxide in relation to the total mass of the aqueous potassium hydroxide solution of approximately 5%.

After removal 110 of the electrically conductive layer 308 from the substrate 300, luminophore layer regions 326 may be formed over or on the optoelectronic components 306. The luminophore layer region 326 may, for example, have a thickness of from approximately 25 μm to approximately 50 μm.

The carrier 302 may be free of electrically conductive layer 302 and luminophore 326 by the process after removal 110 of the electrically conductive layer 308 from the substrate 300.

Figure 4:
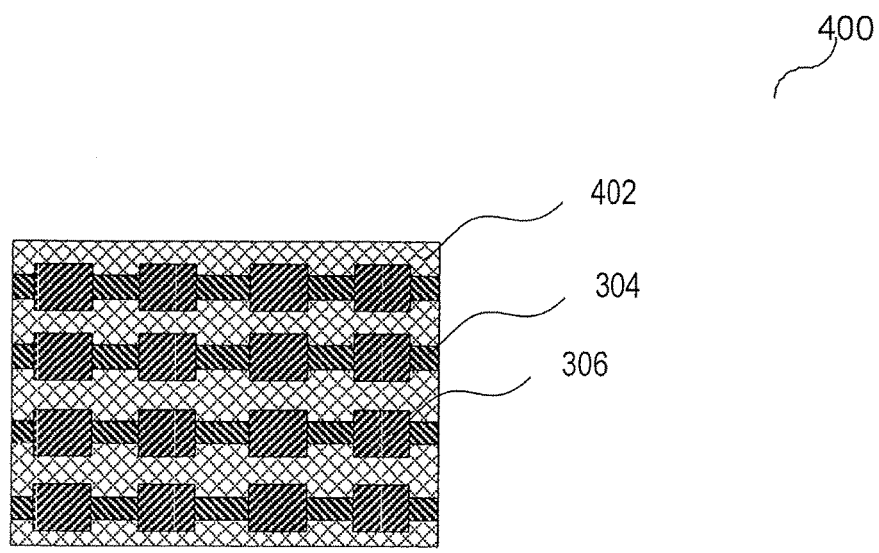
FIG. 4 shows a schematic plan view of a component in the process of producing a component according to various configurations.

FIG. 4 shows a schematic plan view of a component in the process of producing a component according to various configurations.

Various configurations of the process of producing a component of the description of FIG. 3 are represented in FIG. 4, according to the description of FIG. 2.

In another configuration 400 of the component of FIG. 3, electrical contacting 106 of the electrically conductive layer 302 may be carried out instead of the electrical contacting 106 of the electrically autonomous regions 310, 312, 314, 316. In this way, the region between the electrically autonomous regions 310, 312, 314, 316, i.e. the electrically conductive layer 302, can be electrophoretically coated. For example, the optoelectronic components 306 and the electrical connections may be formed uncoated. In this way, after removal of the electrically conductive layer 110, a second electrophoretic layer 402 may be formed on or over the carrier 102 in the regions between the optoelectronic components 306 and electrical connections 304. The second electrophoretic layer 402 may, for example, be formed as a $TiO_2$ reflector layer 402.

To this end, the substrate 300 may be coated electrophoretically in a second suspension, the second suspension being configured as an aqueous solution of $TiO_2$ particles. The proportion by mass of the $TiO_2$ particles to the suspension may be from approximately 0.1% to approximately 1%.

Figure 5:
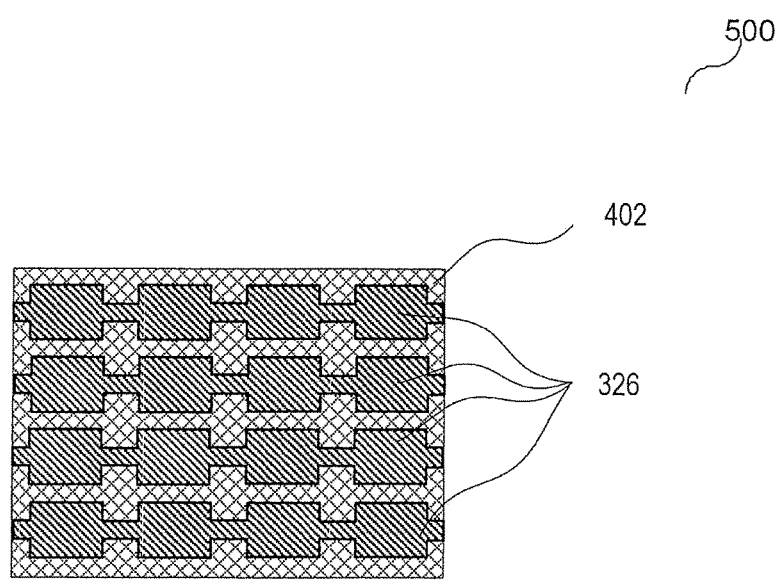
FIG. 5 shows a schematic plan view of a component in the process of producing a component according to various configurations.

FIG. 5 shows a schematic plan view of a component in the process of producing a component according to various configurations.

A second electrical potential difference may be formed on the substrate 300 according to the description of FIG. 3 after the electrophoretic deposition 108 and before the removal of the electrically conductive layer 110. For example, the electrical connections 324 of the structured electrically independent regions 310, 312, 314, 316 may be dissolved and applied onto the electrically conductive layer 308. A $TiO_2$ reflector layer 402 may then be formed on the electrically conductive layer in a second suspension, for example, according to the configuration 400.

After removal of the electrically conductive layer 110, the configuration 500 may comprise a luminophore 326 over or on the optoelectronic components 306 and electrical connections 304, while a $TiO_2$ reflector layer 402 is formed between the luminophore layer regions 326.

Figure 6:
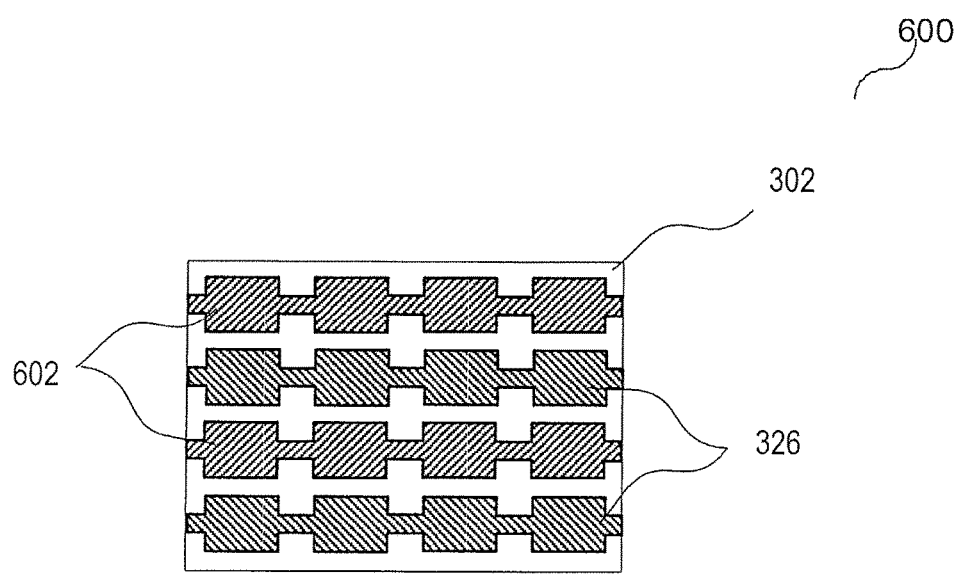
FIG. 6 shows a schematic plan view of a component in the process of producing a component according to various configurations.

FIG. 6 shows a schematic plan view of a component in the process of producing a component according to various configurations.

A first potential difference may be formed on the substrate 300 according to the description of FIG. 3 after formation of the structured electrically independent regions 310, 312, 314, 316 and before the electrophoretic deposition 108, before removal of the electrically conductive layer 110, only in a few of the electrically autonomous regions 310, 312, 314, 316. On these regions, for example, the regions 312 and 316, a first electrophoretic layer 326 may then be formed according to the description of FIGS. 1 and 3. In other words: in the process, the electrically autonomous regions 310, 312 may be understood as a first electrically autonomous region and the electrically autonomous regions 308, 314, 316 may be understood as a second electrically autonomous region.

Before removal 110 of the electrically conductive layer 308, a second electrical potential difference may then be formed on the electrically autonomous regions 310, 314, and brought in physical contact with a second suspension. According to the description of FIG. 2, a second electrophoretic layer 602 may then be electrophoretically applied on or over the electrically autonomous regions 310, 314. The second electrophoretic layer may comprise a second luminophore or be formed therefrom, according to one of the configurations of FIG. 2.

The electrically conductive layer 308 may be removed after formation of the second luminophore layer region 602.

In this way, differently thick luminophore layer thicknesses and/or different luminophores may be formed on a substrate.

In further electrophoretic deposition (not represented), for example, a $TiO_2$ reflector layer 402 may be formed, according to the configuration of FIG. 5, on or over the electrically conductive layer 308, between the first luminophore layer region and the second luminophore layer region.

Figure 7:
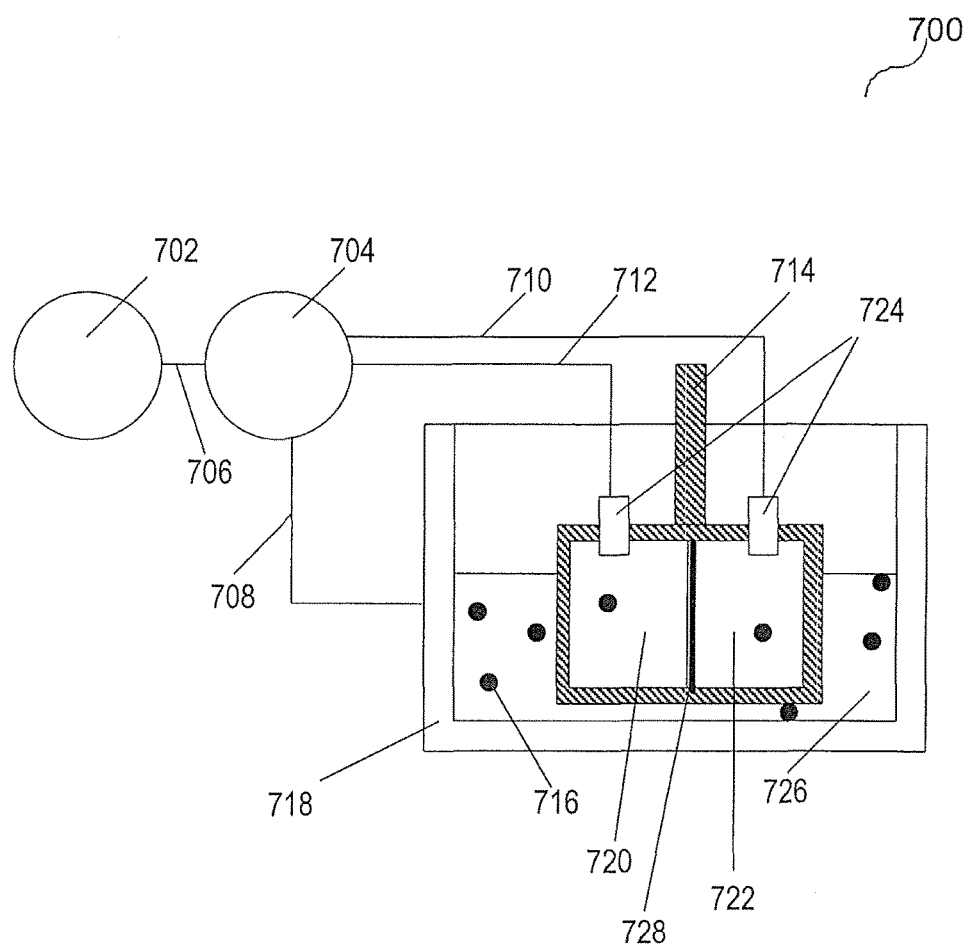
FIG. 7 shows a schematic representation of an apparatus of producing a component according to various configurations.

FIG. 7 shows a schematic representation of an apparatus that produces a component according to various configurations.

A substrate comprising electrically autonomous regions 720, 722 of an electrically conductive layer is represented.

The electrically autonomous regions 720, 722 may be electrically insulated from one another by an insulating region 728 and an electrically insulating substrate under the electrically conductive layer.

The substrate may, for example, be formed according to one of the descriptions of FIGS. 1-6.

The substrate is fixed on a substrate holder 714 and immersed in a container 718 with a first suspension or first dispersion.

The first suspension or first dispersion may in this case be configured according to one of the descriptions of FIGS. 1-6.

The substrate holder 714 is only represented in a very simplified form and schematically since differently shaped substrates may require different substrate holders.

The suspension may comprise a first solvent 726 and a first electrically charged substance 716 or a first electrically charged substance mixture 716, in which case the first electrically charged substance 716 or the first electrically charged substance mixture 716 may be formed as electrically charged particles 716.

The substrate is immersed in the first suspension or first dispersion such that the electrically autonomous regions 720, 722 are partially or fully surrounded by the suspension or dispersion.

The electrically autonomous regions 720, 722 may be in electrical and physical contact with electrical terminals 724. The electrical terminals 724 may be part of the substrate holder 714 and configured to be electrically insulated from the substrate holder 714.

The electrically autonomous regions 720, 722 may be electrically connected to a control circuit 704 by means of electrical terminals 724 of the substrate holder 714 and electrical connections 710, 712.

The control circuit 704 may be electrically connected to a circuit 702 by an electrical connection 706, or it may be formed as a part of a circuit 702.

The control circuit 704 may furthermore be electrically connected to a second electrode, for example, the container 718 by an electrical connection 708.

The circuit 702 may comprise at least one voltage source, for example an alternating-current source or a direct-current source, for example, regulated by a potentiometer, for example, with a maximum voltage of 230 V.

The circuit 702 may provide the first electrical potential difference and/or the second electrical potential difference of the apparatus. The time profile of the first electrical potential difference and/or the second electrical potential difference may be adjusted, for example modulated as a function of time, by the control circuit 704.

The first electrical potential difference may in this case be formed between the first electrically autonomous region 720 and the second electrically autonomous region 722.

The second electrical potential difference may be formed between the first electrically autonomous region 720 and the container 718, and/or between the second electrically autonomous region 722 and the container 718.

Formation of a first electrical potential difference and/or a second potential difference may be understood as electrical connection of the electrically autonomous regions 720, 722 to the circuit 702.

The electrical connection may be carried out manually or mechanically, i.e. electrically, by opening or closing the terminals 724.

The terminals 724 may, for example, be formed as clamps or pins (not represented). Clamps can be opened and closed; in one of the states, for example "closed", physical and electrical contact with an electrically autonomous region is formed.

Pins may, for example, be lowered or raised in which case physical and electrical contact with an electrically autonomous region may, for example, be formed by a lowered pin.

Opening and/or closing of a terminal 724 may, for example, be formed electrically, for example, by an electric motor.

Lowering and/or closing of a terminal 724 may furthermore, for example, be controlled by the control circuit.

Electrical and physical connection of the electrically autonomous regions 720, 722 to the electrical terminals 724 may be formed with the first electrically autonomous region 720 and/or the second electrically autonomous region 722.

The control circuit 704 may convert an alternating current of the circuit 702 into a direct current by a rectifier (not represented). The direct-current circuit may then, for example, be closed by switches and/or potentiometers (not represented) in the control circuit 704 between one of the electrically autonomous regions 720, 722 and the container 718.

The control circuit 704 may, for example, form a second electrical potential which is constant as a function of time, for example, of approximately −50 V to approximately +50 V.

The container 718 may, for example, be grounded.

In positively electrically charged particles 716, for example, phosphor particles 716 dissolved in water 726, a negative electric voltage with a value of approximately −20 V may, for example, be formed via the container 718 and the first electrically conductive region 720. By the second electrical potential, the positively electrically charged phosphor particles 716 can diffuse to the first electrically autonomous region 720 and be deposited on the surface of the first electrically autonomous region 720.

Adjustment of the first electrical potential and the second electrical potential may, however, also be carried out under computer control, i.e. with a graphical user interface.

A process of producing a component and an apparatus that produces a component are provided, with which it is possible to limit the electrophoretic deposition of a substance or substance mixture to defined regions of the surface of a component.

Formation of the defined regions of the surface of the component can be carried out more rapidly and more economically with laser and scratching processes than with photolithography processes. Structuring of electrically conductive surfaces by a laser can be adapted rapidly and straightforwardly to different shapes of the components. Furthermore, laser and scratching processes do not need to be carried out before the separation of components, for example, optoelectronic components (front end). Electrophoretic deposition is self-adjusting by the defined regions. In this way, the demands on the component for the deposition of, for example, luminophore can be reduced, i.e. the component can still be processed even after it has come in contact with, for example, a silicone. Furthermore, multicolor optoelectronic components or optoelectronic components with reflector material between the optoelectronic components can be formed straightforwardly with the process.

The invention claimed is:

1. A process of producing a component comprising:
   providing a substrate having an electrically conductive surface in the form of an electrically conductive layer;
   subdividing the layer with the aid of a laser process into a first electrically autonomous region and a second electrically autonomous region, wherein an electrically insulating region is formed in the electrically conductive layer to electrically separate the electrically autonomous regions;
   forming an electrical potential difference between the first electrically autonomous region and the second electrically autonomous region; and
   applying an electrically charged substance or an electrically charged substance mixture onto the first electrically autonomous region and/or the second electrically autonomous region,
   wherein the electrically autonomous region and/or an amount of the applied electrically charged substance or of the electrically charged substance mixture are adjusted by the electrical potential difference.

2. The process as claimed in claim 1, wherein providing the substrate having an electrically conductive surface comprises forming the electrically conductive layer on or over an electrically insulating surface of the substrate.

3. The process as claimed in claim 1, wherein providing the substrate having an electrically conductive surface comprises forming the electrically conductive layer on or over an electrically insulating surface of the substrate, the electrically insulating surface of the substrate is formed by forming the electrically insulating layer on or over a partially or fully electrically insulating surface of the substrate.

4. The process as claimed in claim 1, wherein forming the electrically insulating region between the electrically autonomous regions comprises chemical crosslinking or chemical degradation of the substance or substance mixture of the electrically conductive layer or a ballistic process.

5. The process as claimed in claim 1, wherein forming the potential difference between the first electrically autonomous region and the second electrically autonomous region comprises connecting at least one electrically autonomous region to a voltage source, and forming a first electrode.

6. The process as claimed in claim 1, wherein, to apply the first electrically charged substance or the first electrically charged substance mixture onto the first electrically autonomous region or the second electrically autonomous region, physical contact of the first electrically autonomous region and/or the second electrically autonomous region with a suspension is formed, wherein the suspension comprises the first electrically charged substance or the first electrically charged substance mixture in a first solvent, and a second electrode is configured in the suspension.

7. The process as claimed in claim 1, further comprising applying a further electrically charged substance or a further electrically charged substance mixture on or over the first electrically autonomous region or the second electrically autonomous region.

8. The process as claimed in claim 1, further comprising applying a further electrically charged substance or a further electrically charged substance mixture on or over the first electrically autonomous region or the second electrically autonomous region,
   wherein the further application of a further electrically charged substance or of a further electrically charged substance mixture comprises modifying one or more parameters selected from the group consisting of:
   the electrical potential difference,
   the electrically charged substance or the electrically charged substance mixture,
   the solvent of the suspension, and
   the layer thickness of the applied further electrically charged substance or electrically charged substance mixture.

9. The process as claimed in claim 1, wherein the component is formed with at least one of a wavelength-converted optoelectronic component or a wavelength-converted light-emitting diode.

10. The process as claimed in claim 1, wherein the component is formed with at least one of a wavelength-converted optoelectronic component or a wavelength-converted light-emitting diode, and the component is formed with a plurality of wavelength-converted optoelectronic components as a multicolor emitting or absorbing optoelectronic component, or a multicolor light-emitting diode.

11. The process as claimed in claim 1, wherein a luminophore is applied onto the first electrically autonomous region and a reflector is applied onto the second electrically autonomous region.

* * * * *